(12) United States Patent
Tabrizian

(10) Patent No.: US 12,028,047 B2
(45) Date of Patent: Jul. 2, 2024

(54) TUNABLE AND SWITCHABLE SAW-BAW RF RESONATORS

(71) Applicant: University of Florida Research Foundation, Incorporated, Gainesville, FL (US)

(72) Inventor: Roozbeh Tabrizian, Gainesville, FL (US)

(73) Assignee: University of Florida Research Foundation, Incorporated, Gainesville, FL (US)

(*) Notice: Subject to any disclaimer, the term of this patent is extended or adjusted under 35 U.S.C. 154(b) by 692 days.

(21) Appl. No.: 17/314,394

(22) Filed: May 7, 2021

(65) Prior Publication Data

US 2021/0359664 A1 Nov. 18, 2021

Related U.S. Application Data

(60) Provisional application No. 63/023,568, filed on May 12, 2020.

(51) Int. Cl.
*H03H 9/02* (2006.01)
*H03H 9/145* (2006.01)
*H03H 9/25* (2006.01)

(52) U.S. Cl.
CPC .......... *H03H 9/25* (2013.01); *H03H 9/02543* (2013.01); *H03H 9/14544* (2013.01)

(58) Field of Classification Search
CPC ... H03H 9/25; H03H 9/02543; H03H 9/14544
USPC ...... 310/313 R, 313 A, 313 B, 313 C, 313 D
See application file for complete search history.

(56) References Cited

U.S. PATENT DOCUMENTS

2022/0407494 A1* 12/2022 Peng ................. H03H 9/02228

* cited by examiner

*Primary Examiner* — Derek J Rosenau
(74) *Attorney, Agent, or Firm* — ALSTON & BIRD LLP

(57) ABSTRACT

An adaptive RF acoustic resonator contains tunable and switchable hybrid surface-bulk acoustic waves (SAW-BAW). The surface and bulk acoustic waves couple for the spectral sensing and configurable filtering. The acoustic resonator includes a piezoelectric or ferroelectric layer, such as a SLAIN layer, which is patterned into interdigital transducers, and an intermediate layer of AlGaN—GaN, which is built on a SiC substrate. The device is protected under a plastic packaging cap. An external tuning voltage applies on the acoustic resonator to generate the tunable frequency and bandwidth of the bulk and surface acoustic waves. An RF switch generates an electric field to suppress a residual polarization during acoustic resonator switching. The bulk acoustic wave excited in the piezoelectric or ferroelectric layer couples with the surface acoustic wave propagating in the intermediate layer. The Sc concentration in the ferroelectric layer exceeds 28%. The transducers are capped with Bragg reflectors made of multiple Al and W layers.

15 Claims, 11 Drawing Sheets

Fig. 4 (a) (top) and Fig. 4 (b) (bottom)

Fig. 5 (a) (top) and Fig. 5 (b) (bottom)

Fig. 6 (a) (top) and Fig. 6 (b) (bottom)

Fig. 7(a) (top left), Fig. 7(b) (top right), and Fig. 7(c) (bottom)

Fig. 9 (a) (top) and Fig. 9 (b) (bottom)

TUNABLE AND SWITCHABLE SAW-BAW RF RESONATORS

CROSS-REFERENCE TO RELATED APPLICATIONS

This application claims priority to U.S. Provisional Application No. 63/023,568, filed May 12, 2020, entitled "TUNABLE AND SWITCHABLE SAW-BAW RF RESONATORS," which is hereby incorporated herein in its entirety by reference.

TECHNICAL FIELD

The present application relates to electromechanical technology, in particular, relates to RF acoustic resonators.

BACKGROUND

A typical interdigital transducer (IDT) is a device that consists of two interlocking comb-shaped arrays of metallic electrodes. These metallic electrodes are deposited on the surface of a piezoelectric substrate to form a periodic structure. IDT's primary function is to convert electric signals to surface acoustic waves by generating periodically distributed mechanical forces via piezoelectric effect. However, most acoustic interdigital transducers lack the continuous frequency configurability, and they experience increased resistive loss from metal films at the electrodes at higher frequencies.

In addition, a fundamental challenge for all ferroelectric electromechanical filter technologies is to null the polarization of ferroelectric films when switching at high frequencies. One conventional approach is to replace the resonators in the filters with large capacitors. The resulting network of capacitors, however, creates an undesirable feedthrough, despite the filter being in "off" state. This causes the performance of the active/on parallel filters in the bank that serve to create the passband to be severely degraded. A need continues to exist for an improved acoustic wave resonator capable of continuous frequency tunability with low-loss and switchability at high frequency.

BRIEF SUMMARY

An acoustic resonator is disclosed according to some embodiments of the disclosure. The acoustic resonator includes a substrate; a first layer disposed on the substrate; a second layer disposed directly on the first layer and comprising a plurality of interdigital transducers; a third layer configured to enclose the acoustic resonator; a first port and a second port configured to supply a first voltage to the acoustic resonator; and an RF switch configured to provide a second voltage over the first layer. A bulk acoustic wave is excited in the second layer, and a surface acoustic wave is generated in the first layer by coupling to the bulk acoustic wave.

In some examples, the substrate comprises silicon carbide.

In some examples, the second layer further comprises a piezoelectric or ferroelectric material, wherein the piezoelectric or ferroelectric material comprises scandium, aluminum, and nitride (ScAlN) films, and wherein the scandium has a concentration exceeding 28%.

In some examples, each of the plurality of interdigital transducers is capped with a Bragg reflector comprising multiple layers of aluminum (Al) and tungsten (W).

In some examples, the first layer comprises aluminum gallium nitride and gallium nitride (AlGaN—GaN).

In some examples, the third layer comprises plastic.

In some examples, the first voltage generates a tunable frequency bandwidth for the bulk acoustic wave and surface acoustic wave.

In some examples, the second voltage of the RF switch is configured to generate an RF electric field to suppress a residual polarization during switching of the acoustic resonator.

In some examples, the interdigital transducers are patterned at a pitch of 150 nm to 1500 nm.

In some examples, a layer of metallic reflector is disposed directly on an intermediate layer to reflect the surface acoustic wave.

In some examples, the RF switch is built into the first layer via plugs and wherein the plugs comprise gallium nitride.

In some other examples, a matrix of acoustic resonators, wherein the matrix comprises of the above plurality of acoustic resonators connected in a pattern combining lattice and ladder networks.

BRIEF DESCRIPTION OF DRAWINGS

FIG. 4(a) shows $Q_{mech}$ of SAW-BAW versus BAW, and FIG. 4(b) shows $Q_{total}$, $Q_{mech}$, and $Q_{elec}$, of SAW-BAW according to some embodiments of SAW-BAW devices.

FIG. 5(a) shows $Q_{elec}$ of SAW-BAW with Mo/Al Bragg reflectors without the Bragg reflectors, and FIG. 5(b) shows Q of SAW-BAW with and without the Mo/Al Bragg reflectors, according to the disclosed embodiments of SAW-BAW resonators.

DETAILED DESCRIPTION

It should be understood that the examples and embodiments described herein are for illustrative purposes only and that various modifications or changes in light thereof will be suggested to persons skilled in the art and are to be included within the spirit and purview of this application.

Such alterations, modifications, and improvements are intended to be part of this disclosure and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

An RF acoustic resonator, in accordance with one embodiment of the present invention, enables spectral processors with dynamic configuration of frequencies and bandwidths. The resonator couples surface-acoustic-waves (SAW) and bulk acoustic waves (BAW) in a stacked platform that includes, in part, scandium-aluminum-nitride (ScAlN), aluminum-gallium-nitride (AlGaN), gallium nitride (GaN), and silicon carbide (SiC). The SAW-BAW ScAlN—AlGaN—GaN—SiC resonator of the present invention provides, among other benefits, the following advantages: (1) Extreme lithographical frequency scalability, enabling monolithic integration of spectral processors over UHF and SHF regimes; (2) DC tunability of resonance frequency; and (3) DC switchability of the resonator operation.

In one embodiment, the resonator is formed by coupling extensional bulk acoustic waves (BAW) excited in $Sc_{0.4}Al_{0.6}N$ transducer with surface acoustic waves (SAW) in SiC, thus creating a hybrid SAW-BAW resonance mode, which simultaneously provides extreme on-chip frequency scalability, electrical frequency tunability, and switchability. The resonator may be formed through a simple and high-yield fabrication and integration process. The fabrication platform is based on silicon carbide (6H—SiC) substrates and sputtered and metal-beam-epitaxy (MBE) $Sc_{0.4}Al_{0.6}N$ films with proven quality. This platform, along with the disclosed SAW-BAW resonator architecture, provides unique physical features that enable simultaneous realization of high Q, ultra-low loss, large frequency tunablity, and embedded switchability over 2-18 GHz.

Figure 2:
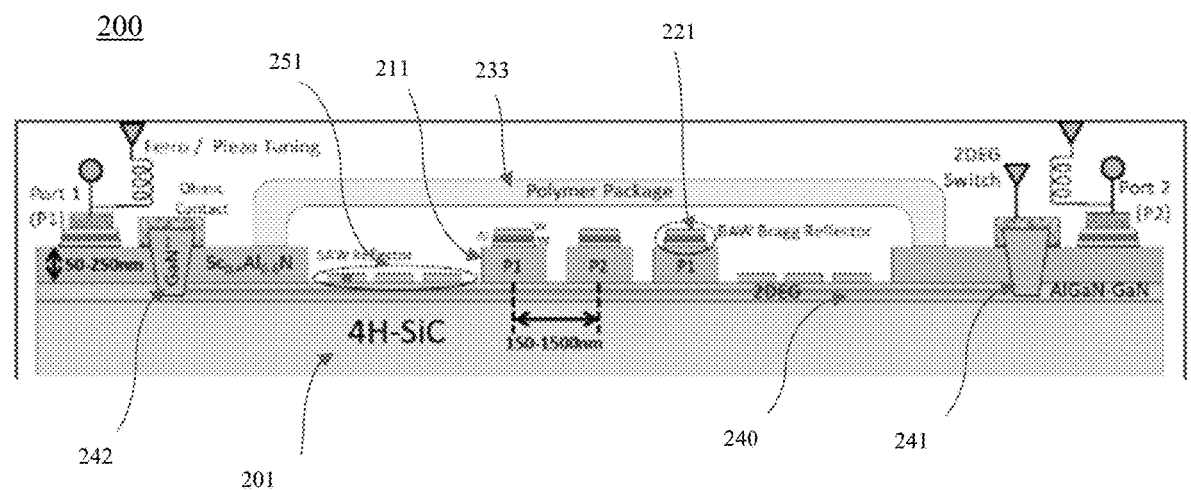
FIG. 2 shows the cross section of a polymer-packaged SAW-BAW tunable and switchable resonator implemented in ScAlN—AlGaN—GaN—SiC, according to some embodiments of the disclosure.

FIG. 2 is a cross-sectional view of a hybrid SAW-BAW resonator, in accordance with one embodiment of the present invention, where the BAW IDTs are patterned atop of a SiC substrate. The bulk waves excited in IDTs are coupled through the surface waves in the 6H—SiC substrate. The acoustic cavity is formed through metallic reflectors surrounding the IDTs to confine the energy for high-Q operation. The resonators are encapsulated with polymer caps to protect them during system-level integration process.

Figure 1A:
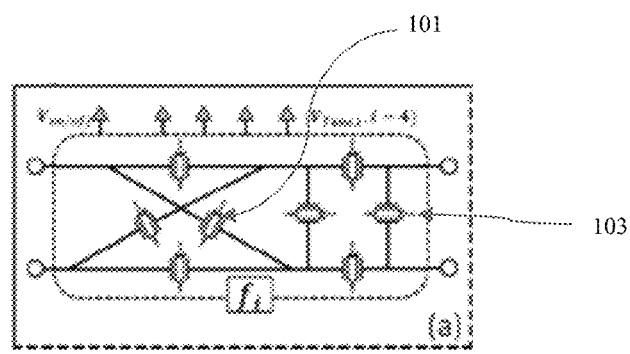
FIGS. 1(a) to 1(d) show the SAW-BAW configurable filter for wideband adaptive spectral processing, according to some embodiments of the disclosure.

The SAW-BAW resonators can be connected together, in lattice-ladder network configuration, to create a widely configurable and switchable filter bank with tunable frequency and bandwidth shown in FIG. 1(a). The highly configurable bandpass lattice-ladder filter network 100 can be created from electrical coupling of tunable and switchable SAW-BAW resonators 101 and 103. The filter architecture enables wide bandwidth tunability without degradation of the out-of-band rejection. To address these requirements, the lattice-ladder electrical coupling configuration is used for creation of bandpass filters with tunable bandwidth.

The switchability of the lattice-ladder filters is achieved through impedance matching of the SAW-BAW resonators in the lattice module and electromechanical switching of the elements in the ladder module. In the adaptive spectral processor, the active passband is defined through selections of the corresponding filters in the bank and off-switching of other filters.

The impedance matching of the resonators in the lattice-ladder module 100 is achieved through piezoelectric or ferroelectric tuning of the constituent resonators 101 and 103 and will result in ~30 dB rejection across the network, for example.

The adaptive RF spectral processing system requires tunable and switchable hybrid surface-bulk acoustic wave (SAW-BAW) resonators for configurable bandpass and band-reject filtering. The SAW-BAW resonator provides the configurable filter banks over 2-20 GHz that simultaneously facilitates extreme on-chip frequency scalability, electrical frequency tunability, and switchability.

According to one embodiment of the disclosure, the fabrication platform is based on silicon carbide (6SiC) substrates with AlGaN—GaN two-dimensional electron-gas (2DEG) and ScAlN films grown atop.

The following is the detailed analytical and numerical analyses to determine approaches for (1) frequency scaling of SAW-BAW resonators over 2-18 GHz while sustaining high quality factor and low impedance, and (2) realization of highly configurable filter SAW-BAW architectures to accommodate frequency and bandwidth tunablity of 9:1 and 5:1 ratios, respectively.

Tunable and Switchable Resonators of SAW-BAW ScAlN—AlGaN—GaN—SiC

Device Architecture

An exemplary resonator is created from coupling extensional bulk acoustic waves (BAW) excited in $Sc_{0.4}Al_{0.6}N$ transducers coupling with surface acoustic waves (SAW) in AlGaN—GaN—SiC, forming a hybrid SAW-BAW resonance mode.

In FIG. 2, the hybrid SAW-BAW resonator 200 includes the bulk acoustic waves interdigital transducers (BAW IDTs) 211, such as P1, P2, and P3 patterned in the piezoelectric or ferroelectric layer atop the silicon carbide (SiC) substrate 201. The pitch of the IDTs are set in the range of 150-1500 nm. The bulk waves excited in IDTs 211 are coupled through the acoustic surface waves in the substrate 201 of 4H—SiC (a polytype of SiC having 8 atoms per unit cell) substrate. The acoustic cavity is formed through the metallic Bragg reflectors 221 surrounding the IDTs 211 to confine the energy for high-Q operation. The resonators are encapsulated with a polymer package 233 to protect them during system-level integration process.

Device Characteristics

1. Extreme Frequency Scalability:

The invented hybrid SAW-BAW architecture exceeds the performance of traditional piezoelectric bulk acoustic wave technologies through providing extreme lithographical frequency scalability. The frequency of the hybrid SAW-BAW mode is not only defined by the thickness of the piezoelectric bulk acoustic wave transducers, but also depends on the pitch size of the BAW IDT 211.

The disclosed hybrid SAW-BAW architecture exceeds the performance of traditional piezoelectric BAW technologies through providing extreme lithographical frequency scalability. The frequency of the hybrid SAW-BAW mode is not only defined by the thickness of the piezoelectric BAW transducer, but also depends on the IDT pitch size that defines the corresponding wavelength of the coupling SAW.

Figure 3:
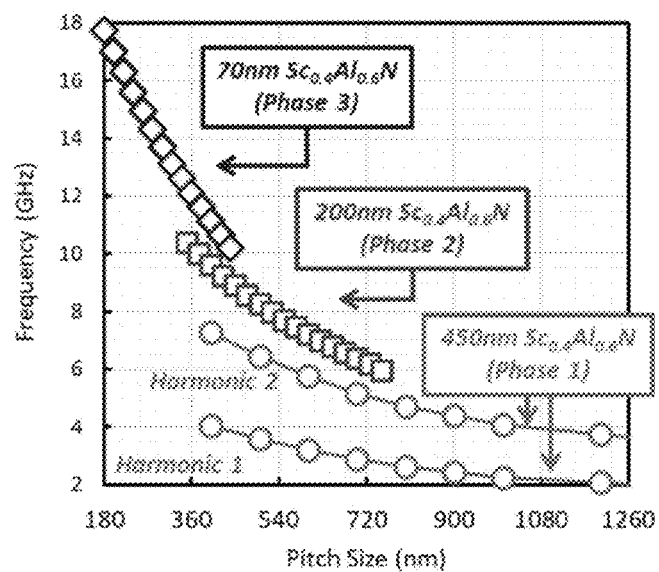
FIG. 3 shows the frequency versus pitch-size chart of the SAW-BAW resonators for different $SC_{0.4}Al_{0.6}N$ thickness and IDT pitch-size, in a spectra range from 2 to 18 GHz.

FIG. 3 shows the frequency versus pitch-size chart of the SAW-BAW resonators for different $Sc_{0.4}Al_{0.6}N$ thickness and IDT pitch-size, in a spectra range from 2 to 18 GHz, highlighting three separate fabrication batches with different transducer thicknesses, to cover the entire 2-18 GHz. For each transducer thickness, two harmonics, Harmonics 1 and Harmonics 2, of SAW-BAW, with an approximate frequency ratio of 2, can be used to implement the desirable filter. The $Sc_xAl_{1-x}N$ film will be sputtered as one possibility for thicker films at 450 nm to 200 nm, and molecular beam epitaxy (MBE) process can also be used for film at 70 nm or thinner, to ensure single-crystal quality of the $Sc_xAl_{1-x}N$ film that enables sustaining a high Q at higher end of the spectrum of interest.

2. Quality Factor Enhancement

The unique feature of the SAW-BAW resonator is the use of Bragg reflectors as the top electrode 221 as shown in FIG. 2. These electrodes 221 are created from alternating stacking of metals of low and high-acoustic-impedance, that may enable an acoustic bandgap around the resonance frequency of the device. The alternating stack of metals can be, e.g. aluminum (Al) and tungsten (W), to realize a thick low-loss electrode while avoiding the frequency and Q loading of the increased electrode thickness. This feature is of crucial importance considering the increased resistive loss of metal films at higher frequencies.

The high-Q of RF acoustic resonators, despite their miniature footprint, is one of the main motivating factors to develop a wideband adaptive spectral processor based on large-scale arraying of resonators and filters. The SAW-BAW resonator design optimization to sustain a high Q over the entire 2-18 GHz is crucial to achieve the required insertion loss of the spectral processor. The Q of SAW-BAW resonators, mainly governed by the intrinsic mechanical dissipation mechanisms and ohmic loss of the electrodes, is related to lumped elements in resonator model as follows:

$$Q \approx (Q_{mech}^{-1} + Q_{elec}^{-1})^{-1} \frac{2\pi f_{res} L m}{R_s + R_m}.$$

In order to reach the highest Q, both $R_m$ (e.g., motional/mechanical resistance) and $R_s$ (e.g., electrode resistance) should be minimized over the 2-18 GHz spectrum.

Figure 4:
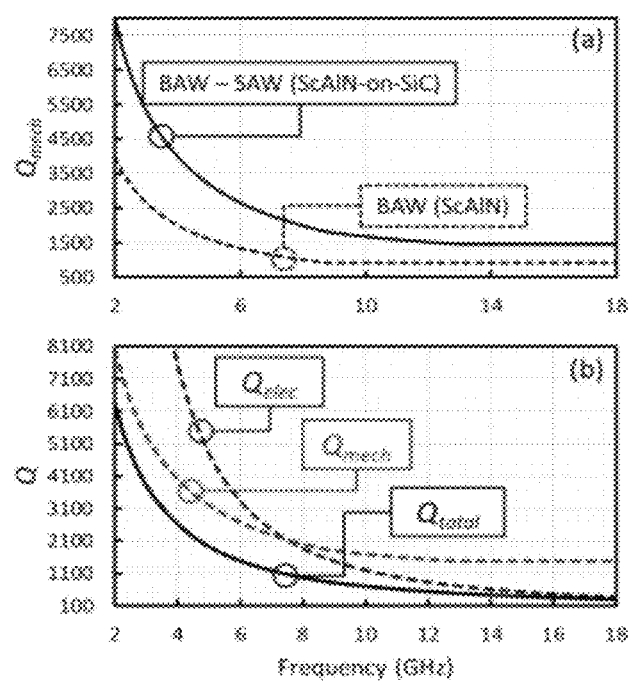
FIG. 4 illustrates the analytically modeled Q factors of the resonators.

FIG. 4(a) shows $Q_{mech}$ of SAW-BAW versus BAW and FIG. 4(b) shows $Q_{total}$, $Q_{mech}$, and $Q_{elec}$, of SAW-BAW according to some embodiments of SAW-BAW devices. Benefiting from single-crystal SiC, known for its exceptionally low acoustic energy dissipation, the disclosed SAW-BAW resonator technology is in a superior position compared to traditional piezoelectric BAW counterparts, as shown in FIG. 4(a). BAW-SAW (ScAlN-on-SiC) resonators show doubled Q factors (solid line) over BAW (ScAlN) Q factor (dashed line), especially at high frequencies. In conventional BAW resonators, as shown in FIG. 4(b), the $Q_{mech}$ sets the Q limit at the lower end of the spectrum.

However, scaling the frequency to higher frequencies requires proportional reduction in the thickness of transducer stack layers (e.g., $Sc_{0.4}Al_{0.6}N$ layer and metal electrodes), which results in substantial increase in electrode loss (e.g., $R_s$).

To prevent the excessive increase in the resistive loss at higher frequencies, a new type of electrode architecture is used based on stacking aluminum (Al) and molybdenum (Mo) layers. Opting for proper thicknesses to create a W—Al acoustic mirror around the resonance frequency, as shown as 221 in FIG. 2, the approach substantially reduces the electrode resistance despite frequency scaling to 18 GHz.

Figure 5:
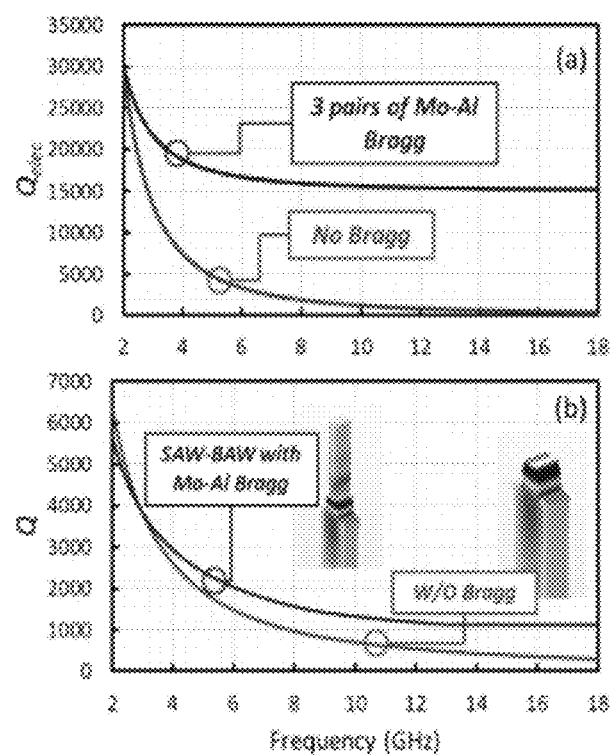
FIG. 5 illustrates analytically modeled Q factors relative to the Bragg reflectors.

FIG. 5(a) compares simulated electrical Q factor $Q_{elec}$ of SAW-BAW resonators with electrodes formed of 3 pairs of Mo—Al Bragg reflector and the same Q factor of SAW-BAW without any Bragg reflector. Bragg reflector has played an overwhelming effect on the electrode Q, especially at high frequencies. FIG. 5(b) compares analytically modeled Q of the SAW-BAW resonator, with one paired Bragg electrodes and those resonators without any Bragg electrodes. The addition of the Bragg stack sustains the resonator Q higher than 1,000 over the entire 2-18 GHz, however there is ~10-times higher than the SAW-BAW counterpart with conventional single-layered electrodes.

3. Resonator Frequency Tunability

The bandpass filters are created from electrical coupling of tunable and switchable SAW-BAW resonators. To cover the wide spectrum of the spectral process with a minimum number of filters, hence reducing complexity of adaptive control architecture, the filter design should be optimized to ensure the maximum bandwidth at each frequency. Furthermore, the filter architecture should be chosen to ensure a large out-of-band rejection across the 2-18 GHz spectrum of interest. Finally, the filter architecture should enable wide bandwidth tunability without degradation of the out-of-band rejection. To address these requirements, lattice-ladder electrical coupling configuration is used for creation of bandpass filters with tunable bandwidth. To achieve a continuous bandwidth configurability, the filter architecture exploits the frequency tunablity of SAW-BAW resonators that identify the cut-off frequencies of the passband shown as $f_i$ in FIG. 1(a). The disclosed $Sc_{0.4}Al_{0.6}N$-on-SiC SAW-BAW resonator provides a large frequency tuning through the application of a DC voltage Von/off across the piezoelectric or ferroelectric transducer, to change the piezoelectric coefficients and relative permittivity dynamically. The piezoelectric or ferroelectric behavior was recently observed in ScAlN films when Scandium concentration exceeded beyond 28%.

Figure 6:
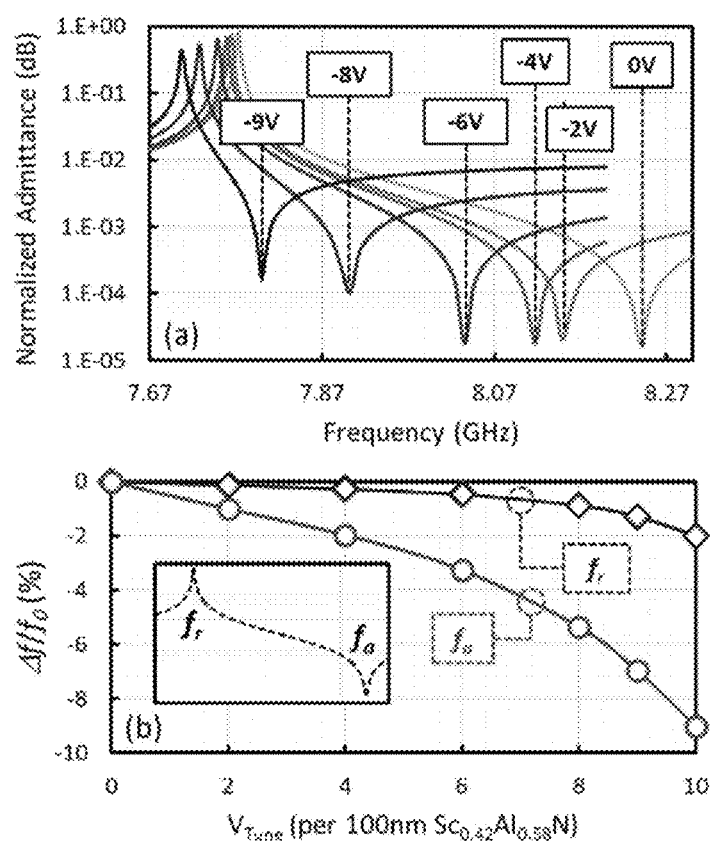
FIG. 6(a) shows simulated admittance of the SAW-BAW resonator with a $Sc_{0.42}Al_{0.58}N$ transducer over different DC biases. The dependence of $Sc_{0.42}Al_{0.58}N$ permittivity and polarization is taken from measured data.
FIG. 6(b) shows the tuning characteristic of resonance and anti-resonance frequencies of disclosed SAW-BAW resonator.

FIG. 6 shows the measured DC-tunablity of the dielectric constant of $Sc_{0.4}Al_{0.6}N$ and its simulated effect on the resonator admittance, which highlights the ~10% tunability of the antiresonance frequency with 10V bias. This is more than sufficient to accommodate the 500% tunability of the filter bandwidth. To provide the required bandwidth tunability of the filter, the lattice architecture will be cascaded by a ladder of series and shunt SAW-BAW resonators. These resonators provide additional zeros in the transmission response of the filter and facilitate dynamic tuning of the bandwidth without degrading the out-of-band performance.

Figure 9:
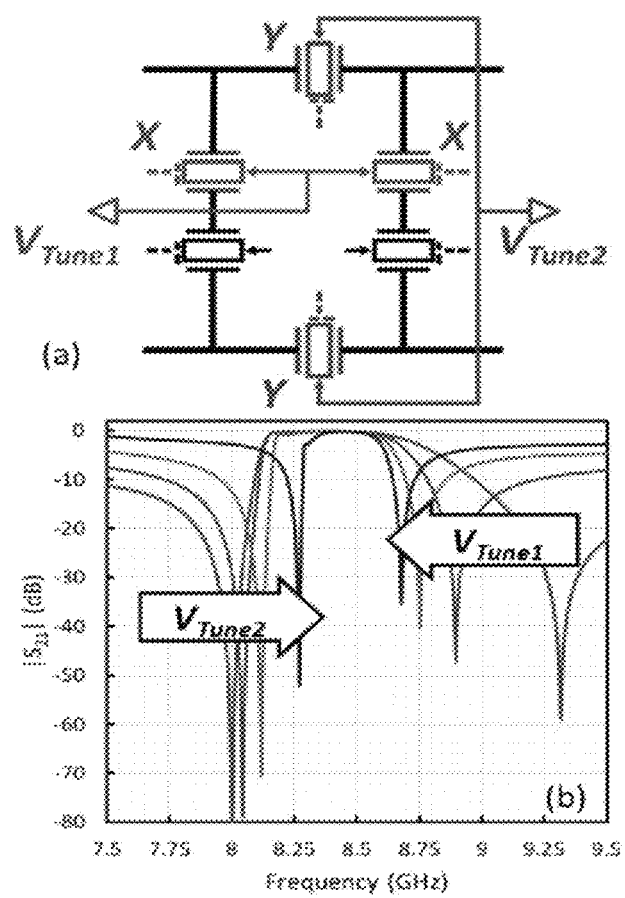
FIG. 9(a) illustrates the architecture of one ladder SAW-BAW device.
FIG. 9(b) shows plots of simulated transmission in response of the ladder filter block enabling the required 5:1 bandwidth tuning.

FIG. 9 shows the ladder architecture and its simulated transmission response for different tuning voltages. FIG. 9(a) illustrates the architecture of the block of resonators for the one ladder SAW-BAW device. $V_{Tune\ 1}$ is the tuning at one side for bandwidth of frequency 1, and the tuning at another side for frequency 2 bandwidth $V_{Tune\ 2}$ will tune to frequency bandwidth 2 after the ladder resonators Y and lattice resonator X. Frequency 2 has only one out of five (1:5) of frequency 2 in bandwidth. FIG. 9(b) shows curves of the simulated transmission in response of the ladder filter block enabling the required 5:1 bandwidth tuning.

In the disclosed ladder configuration, the anti-resonance frequency of selected resonators will be tuned to change the zero and the pole of the shunt and series branches, respectively. This enables independent tuning of either or both cut-off frequencies of the passband.

4. Resonator Switchability

Figure 1B:
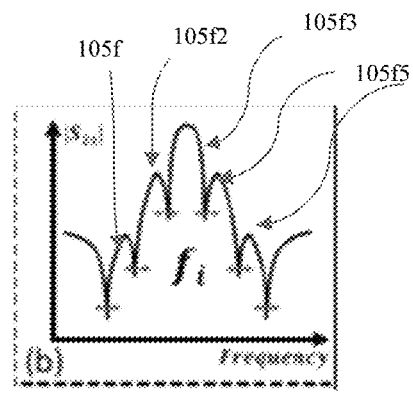

The disclosed $Sc_{0.4}Al_{0.6}N$-on-SiC resonator technology enables DC switchability, which further enables realization of switchable multi-frequency filter banks and the creation of ultra-wide-band spectral processors. FIG. 1(b) shows the spectral response of the multi-frequency filter banks. Each spectral peak from one resonator provides a well-defined narrow filter bank, such as 105/1, 105/2, 105/3, 105/4, and 105/5, but their joint spectra $f_i$ or partial joint spectra after proper adjustment contributes to a nearly continuous broad spectra at selected bands. By the adjustments, frequency banks can be switched accordingly. Such switchability not only is required for definition of the active passband within the bank, but also is essential to suppress the impedance loading on parallel filters in the bank.

The disclosed device for center frequency tunablity of the spectral processor relies on the use of a switchable bank of bandpass filters. Such switchability not only is required for definition of the active passband, but also is essential to suppress the impedance loading on parallel filters in the bank. The disclosed $Sc_{0.4}Al_{0.6}N$-on-SiC resonators benefit from the piezoelectric or ferroelectric switchability that can be achieved by application of the coercive voltage (e.g., ~20V per 100 nm $Sc_{0.4}Al_{0.6}N$) across the transducer to null the film polarization, and the electromechanical transduction, consequently. While such a switchability mechanism removes the motional impedance of the resonator and attenuates the passband of the filter, it may not be sufficient for attenuation of the out-of-band rejection. Furthermore, at lower frequencies (e.g., 2-6 GHz) where a thick $Sc_{0.4}Al_{0.6}N$ film is used, accommodating the large coercive voltage may be challenging.

In this disclosure, a two-dimensional electron gas (2DEG) is realized as an alternative mechanism that not only reduces the switching voltage by an order or magnitude, but also substantially resolves the impedance loading of resonators and filters in the off-state. In this device, application of the required voltage to deplete the 2DEG, substantially reduces the electric field across the $Sc_xAl_{1-x}N$ transducer and switches the resonator off.

Figure 1C:
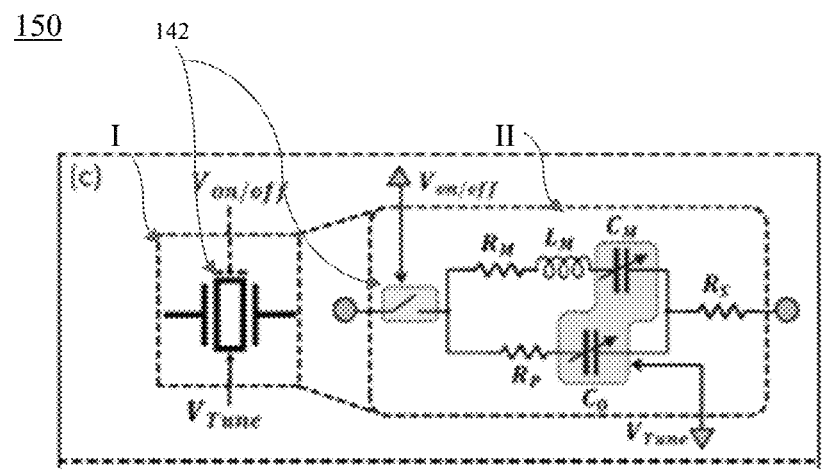
Figure 1D:
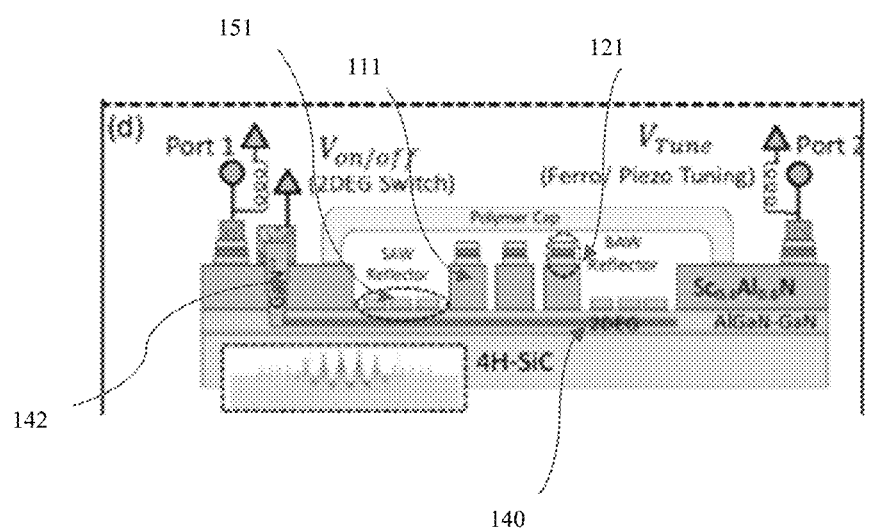

Current piezoelectric or ferroelectric electromechanical filter technologies replace the resonators in the filter with a large capacitor, creating an undesirable feedthrough. This disclosed design of the resonators has overcome the residual ferroelectric film polarization issue by introducing an additional voltage Von/off as shown in FIGS. 1(c) and 1(d). FIG. 1(c) shows the schematic circuit diagram of the resonator 150. FIG. 1(d) shows the cross section of the resonator 150 in FIG. 1(c). Referring to FIG. 1(c), there is a dashed box I at left and a dashed box II on the right, which disclose details of the circuit inside the left dashed box I. The resonator 150 has two external voltages V tune and Von/off 142. Herein V tune is the voltage applied on Port 1 and Port 2 in FIG. 1(d) across the full resonator $Sc_{0.4}Al_{0.6}N$-on-SiC to tune the filter bands in the ferroelectric package. Von/off 142 is a coercive voltage (e.g., ~25V) applied in part of the resonator film stack $Sc_{0.4}Al_{0.6}N$-on-SiC to overcome the polarization. The disclosed $Sc_{0.4}Al_{0.6}N$-on-SiC resonators are benefited from the piezoelectric or ferroelectric switchability that can be achieved by application of the Von/off 142 across the transducer to null the piezoelectric film polarization and the electromechanical transduction, consequently. While such switchability mechanism removes the motional impedance of the resonator and attenuates the passband of the filter, it may not be sufficient for attenuation of the out-of-band rejection.

As described above, Von/off 142 is applied, through a gallium nitride (GaN) plug, over part of the film stack between Port 1 and Port 2 to suppress the residual polarization in the film at the time of frequency switching. In this technology, a two-dimensional electron gas (2DEG) 140 is used as an additional switching mechanism to substantially enhance the on-off ratio of the ferroelectric electromechanical resonators. The two-dimensional electron gas 240 only exists between the two electrodes 241 and 242 where Von/off 242 is applied. In this approach, application of the required voltage to deplete the 2DEG, substantially reduces the electric field across the ferroelectric transducer and switches the resonator off.

Referring to FIG. 1(d), the cross section of the surface acoustic waves (SAW) and bulk acoustic waves (BAW) in a stacked platform. In addition to the V tune and Von/off 142 described above, the ferroelectric film $Sc_{0.4}Al_{0.6}N$/AlGaN—GaN is disposed on a 4H—SiC (an 8-atom unit polytype of SiC) substrate. The $Sc_{0.4}Al_{0.6}N$ film is patterned into interdigital transducers 111, and each transducer top surface is capped with a multi-layered Bragg reflector 121. A continuous film AlGaN is attached under the $Sc_{0.4}Al_{0.6}N$ film. Port 1 and Port 2 are applied an external V tune voltage through the film in between the two ports and a bulk acoustic wave (BAW) is excited in the $Sc_{0.4}Al_{0.6}N$ film and propagates over the interdigital transducers through the coupling of the surface acoustic wave (SAW). The inter-coupling of BAW and SAW facilitates the acoustic wave oscillation in the resonator's cavity. The surface acoustic wave reflectors 151 are disposed directly on the surface of the AlGaN—GaN between the interdigital transducers 111 to reduce surface wave leaks. A polymer cap is placed over the piezoelectric or ferroelectric film stack to protect the device from environmental contamination.

Figure 7:
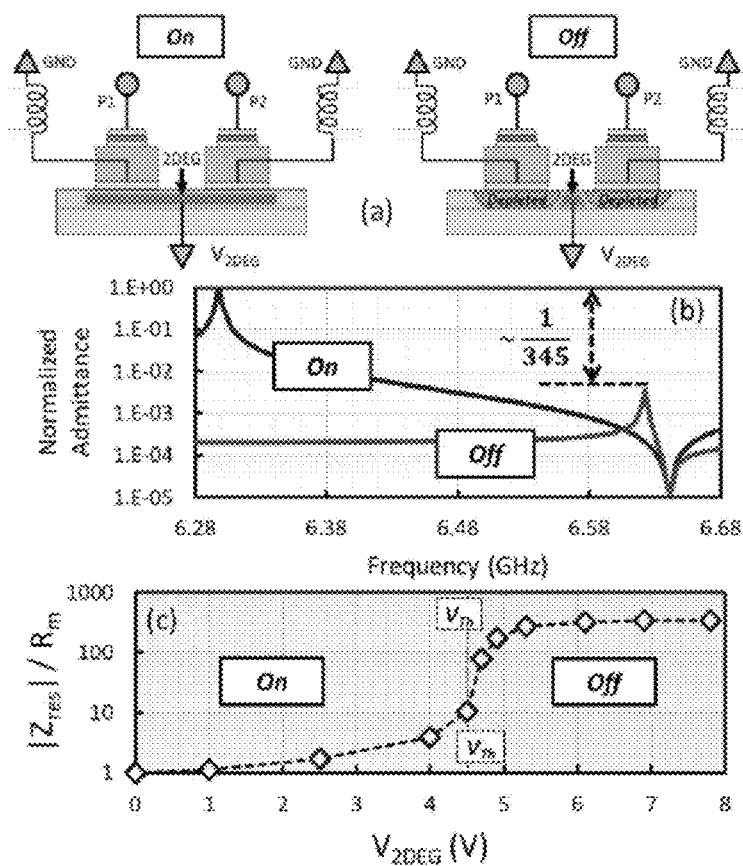
FIG. 7(a) shows the embedded-switching concept based on the use of 2DEG (2D electron gas) depletion.
FIG. 7(b) shows the simulated admittance versus frequency of the SAW-BAW resonators in "on" and "off" states.
FIG. 7(c) illustrates the simulated off-on impedance ratio across different 2DEG switching voltages.

FIG. 7(a) schematically shows this concept and compares the simulated impedance of the SAW-BAW resonator in on and off states. There is an additional conductive layer at the interface of the AlGaN layer and the port 1 for P1 and port 2 for P2 to apply an external voltage directly. FIG. 7(b) shows the simulated resonator admittance across the DC voltages applied to the two-dimensional Electron Gas (2DEG). FIG. 7(c) shows the simulated off-on ratio of resonator impedance for different DC voltages applied to the 2DEG. In on-state, $V_{2DEG}$ is close to zero, and tuning voltage is dominant in the ferroelectric layer tuning function. But as $V_{2DEG}$ increases, the electric field under the transducers depletes the electrons, which in turn shuts off the resonator. A ~350-times increase by ~8V in resonator's impedance can be achieved. The disclosed device-embedded switching mechanism is fundamentally superior to conventional non-embedded approaches, such as in PCM (Phase-change-material) or HEMT (High-electron-mobility transistor), etc., as it does not add any additional insertion loss to the resonators and filters in the on-state. Furthermore, while the disclosed approach benefits from ultra-fast switchability of the 2DEG, proper lay-out optimization will be used for effective access to the 2DEG, to minimize the on-off switching time to sub-100 nanoseconds.

The active passband is defined through selection of the corresponding filter in the bank and off-switching of other filters. The switchability of the lattice-ladder filters is achieved through impedance matching of the SAW-BAW resonators in the lattice module and switching of the elements in the ladder module. The impedance matching of the resonators in the lattice module will be achieved through ferroelectric tuning of the constituent resonators and will result in ~20 dB rejection in the passband. Additional ~30 dB rejection, over both pass- and stop-band will be achieved through 2DEG depletion of the series resonators in the ladder.

Figure 10:
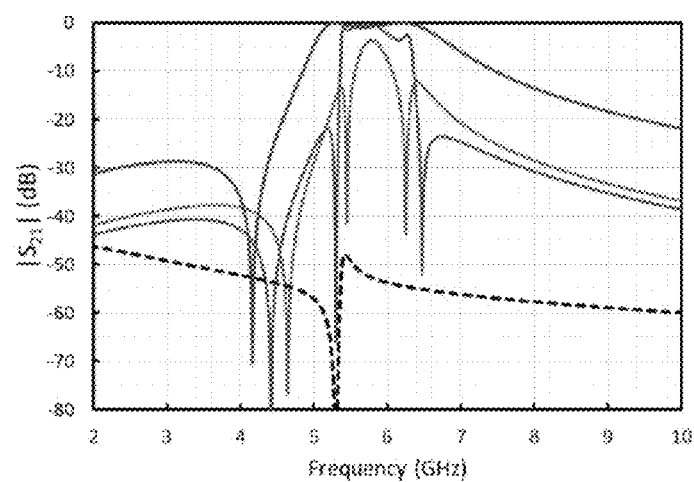
FIG. 10. Illustrates the simulated transmission response of a ladder-lattice SAW-BAW filter under different tuning/switching scenarios.

FIG. 10 shows the frequency response of the filter in off-state, showing a ~50 dB rejection from the top solid curve to the bottom dashed curve.

5. Filter Bank Optimization

Figure 8:
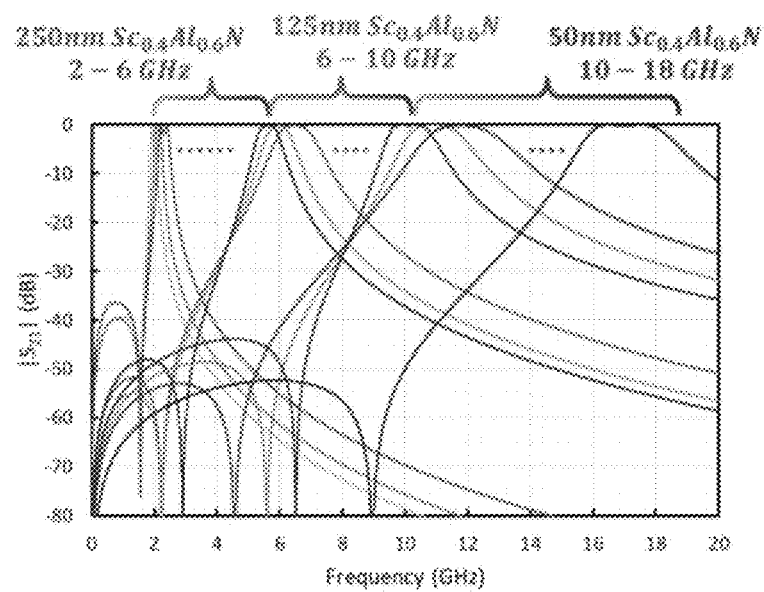
FIG. 8. Illustrates a simulated transmission response of the lattice filters optimized to cover the entire 2-18 GHz spectrum in 18 bands.

FIG. 8 shows the simulated bandpass filters covering the 2-18 GHz spectrum. An array of 18 bandpass filters with frequency and bandwidths optimized to fully cover the 2-18 GHz spectrum is developed. In this figure, there are three sets of filters as an example. The first set of filters covering 2-6 GHz includes a 250 nm thick ScAlN film, the second set of filters covering 6-10 GHz includes a 125 nm thick ScAlN film, and the third set of filters covering 10-18 GHz includes a 50 nm thick ScAlN film. The individual filters are created from coupling of SAW-BAW resonators in lattice configuration. This configuration not only enables achieving the maximum bandwidth, limited by the $k_{eff}^2$ of the constituent resonators, but also provides the large out-of-band rejection. These filters will be implemented in three fabrication batches with different ScAlN transducer thicknesses, corresponding to the various embodiments.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. An acoustic resonator comprising:
   a substrate;
   a first layer disposed on the substrate;
   a second layer disposed directly on the first layer and comprising a plurality of interdigital transducers;
   a first port and a second port configured to supply a first voltage to the acoustic resonator; and
   an RF switch configured to provide a second voltage over the first layer;
   wherein a bulk acoustic wave is excited in the second layer, and a surface acoustic wave is generated in the first layer by coupling to the bulk acoustic wave; and
   wherein the RF switch is further configured to turn off the resonator by depleting the first layer.

2. The acoustic resonator of claim 1, wherein the substrate comprises silicon carbide.

3. The acoustic resonator of claim 1, wherein the second layer further comprises a ferroelectric material stack, wherein the ferroelectric material stack comprises scandium, aluminum, and nitride (ScAlN), and wherein the scandium has a concentration exceeding 28%.

4. The acoustic resonator of claim 1, wherein each of the plurality of interdigital transducers is capped with a Bragg reflector comprising alternating layers of aluminum (Al) and tungsten (W) to match acoustic impedance of the acoustic resonator.

5. The acoustic resonator of claim 1, wherein the first layer comprises aluminum gallium nitride and gallium nitride (AlGaN—GaN).

6. The acoustic resonator of claim 1, further comprising a third layer enclosing the resonator, wherein the third layer comprises a plastic packaging material.

7. The acoustic resonator of claim 1, wherein the first voltage generates a tunable frequency bandwidth for the bulk acoustic wave and the surface acoustic wave.

8. The acoustic resonator of claim 1, wherein the second voltage of the RF switch is configured to generate an RF electric field to suppress a residual polarization during switching of the acoustic resonator.

9. The acoustic resonator of claim 1, wherein each of the plurality of interdigital transducers is patterned at a pitch of 150 nm to 1500 nm.

10. The acoustic resonator of claim 1, wherein a layer of metallic reflector is disposed directly on an intermediate layer to reflect the surface acoustic wave.

11. The acoustic resonator of claim 1, wherein the RF switch comprises two electrodes, wherein the two electrodes are built into the first layer via conductive plugs, and wherein the conductive plugs comprise gallium nitride.

12. The acoustic resonator of claim 11, wherein the two electrodes of the RF switch form Schottky contacts.

13. The acoustic resonator of claim 1, wherein the first port and the second port each further comprises a conductive layer at an interface with the first layer.

14. The acoustic resonator of claim 1, wherein the second layer further comprises a piezoelectric material.

15. A matrix of acoustic resonators, wherein the matrix comprises of a plurality of acoustic resonators of claim 1, and wherein the plurality of acoustic resonators is connected in a pattern combining lattice and ladder networks.

* * * * *